US006911083B2

(12) United States Patent
Hara

(10) Patent No.: US 6,911,083 B2
(45) Date of Patent: Jun. 28, 2005

(54) METHOD FOR PRODUCING POWDERS MADE OF GALLIUM NITRIDE AND APPARATUS FOR PRODUCING THE SAME

(75) Inventor: Kazuhiko Hara, Yokohama (JP)

(73) Assignee: Tokyo Institute of Technology, Tokyo (JP)

(*) Notice: Subject to any disclaimer, the term of this patent is extended or adjusted under 35 U.S.C. 154(b) by 237 days.

(21) Appl. No.: 10/207,099

(22) Filed: Jul. 30, 2002

(65) Prior Publication Data

US 2003/0226497 A1 Dec. 11, 2003

(30) Foreign Application Priority Data

Jun. 11, 2002 (JP) ........................................ 2002-169784

(51) Int. Cl.[7] .......................... C30B 25/00; C30B 29/00
(52) U.S. Cl. ......................................... 117/91; 117/952
(58) Field of Search .............................. 117/91, 88, 94, 117/90, 89, 952

(56) References Cited

U.S. PATENT DOCUMENTS

| | | | | |
|---|---|---|---|---|
| 4,144,116 A | * | 3/1979 | Jacob et al. .................. | 117/91 |
| 5,294,565 A | * | 3/1994 | Shiraishi ...................... | 117/95 |
| 6,096,282 A | * | 8/2000 | Kaner et al. ................. | 423/409 |
| 6,120,748 A | * | 9/2000 | Kaner et al. ................. | 423/290 |
| 6,139,628 A | * | 10/2000 | Yuri et al. .................... | 117/89 |
| 6,177,057 B1 | * | 1/2001 | Purdy .......................... | 423/409 |
| 6,406,677 B1 | * | 6/2002 | Carter et al. ................. | 423/276 |
| 2002/0158267 A1 | * | 10/2002 | Kelsey, Jr. .................... | 257/103 |
| 2003/0012874 A1 | * | 1/2003 | Lange et al. ................. | 427/240 |
| 2003/0183155 A1 | * | 10/2003 | D'Evelyn et al. ............. | 117/68 |
| 2003/0209191 A1 | * | 11/2003 | Purdy .......................... | 117/84 |

FOREIGN PATENT DOCUMENTS

| JP | A 2000-198978 | 7/2000 |
|---|---|---|
| JP | 2001-151504 | 6/2001 |

OTHER PUBLICATIONS

Balkas et al., "Synthesis Routes and Characterization of High–Purity, Single–Phase Gallium Nitride Powders", J. American Ceramic Society, vol. 79, No. 9, pp. 2309–2312.
Shibata et al., "Synthesis of gallium nitride by ammonia injection into gallium melt", Journal of Crystal Growth, vol. 196, pp. 47–52, 1999.
Dwili–ski et al., "AMMONO method of BN, AlN and GaN synthesis and crystal growth" MRS Internet Journal Nitride Semiconductor Research, vol. 3, No. 25, pp. 1–4, 1998.
Kanie et al., "GaN Phosphors for Field Emission Displays", 2nd International Symposium on Blue Laser and Light Emitting Diodes, pp. 552–555, Sep. 29–Oct. 2, 1998.

* cited by examiner

Primary Examiner—Nadine G. Norton
Assistant Examiner—Matthew Anderson
(74) Attorney, Agent, or Firm—Oliff & Berridge, PLC

(57) ABSTRACT

In a creation section of GaN crystal nuclei, a gallium vapor and an ammonia gas are chemically reacted to create GaN crystal nuclei, which are transported into a growth section of GaN powders with a nitrogen carrier gas. In the growth section of GaN powders, a gallium chloride created in a pre-reactor is chemically reacted with the ammonia gas transported from the creation section of GaN crystal nuclei on the GaN crystal nuclei, to produce GaN powders through the crystal growth.

16 Claims, 5 Drawing Sheets

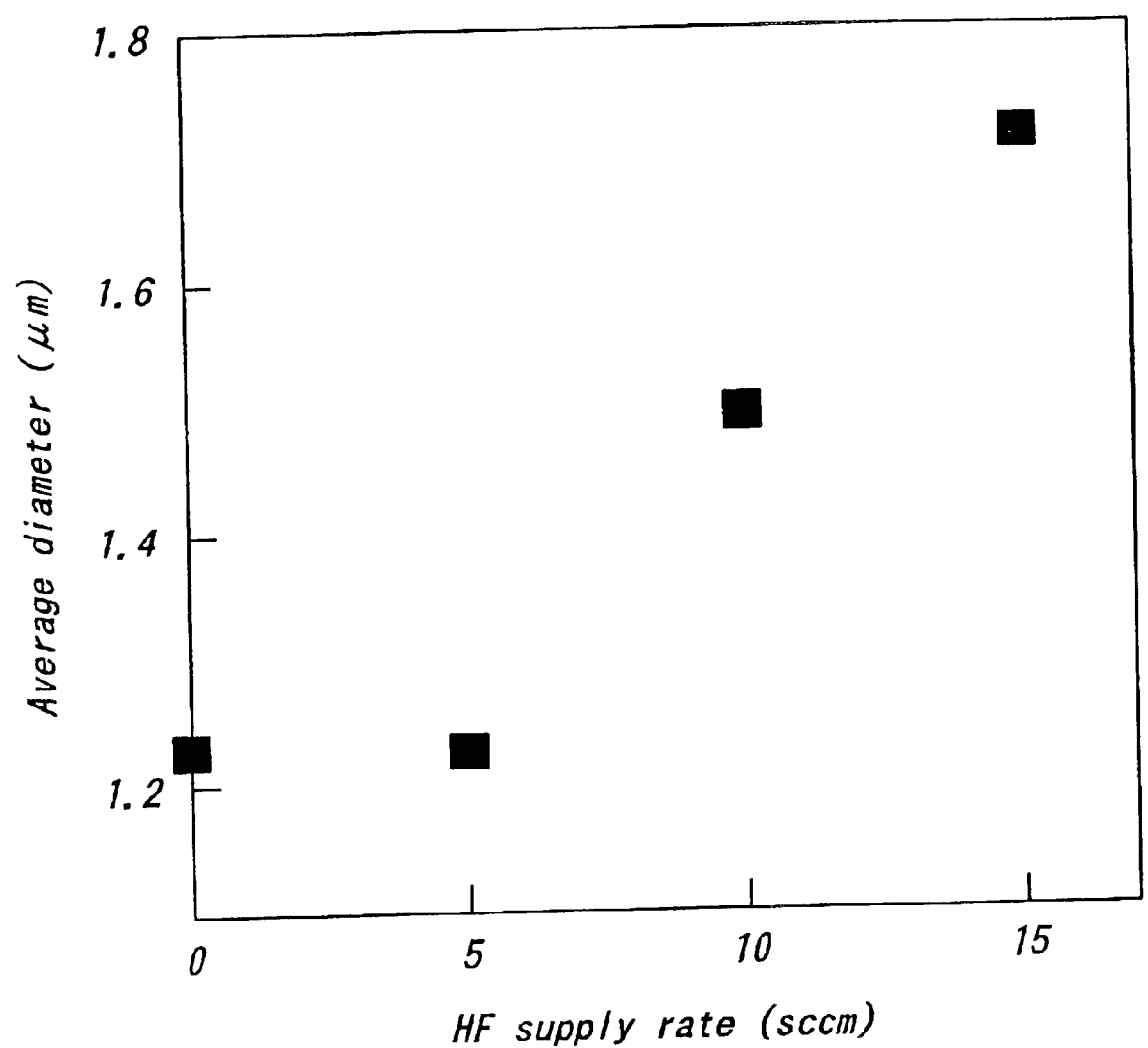

METHOD FOR PRODUCING POWDERS MADE OF GALLIUM NITRIDE AND APPARATUS FOR PRODUCING THE SAME

BACKGROUND OF THE INVENTION

1. Field of the Invention

This invention relates to a method for producing gallium nitride powders and an apparatus for producing the gallium nitride powders which are preferably employed as fluorescent powders to make an optical display.

2. Description of the Prior Art

Recently, a short wavelength semiconductor laser and a light-emitting diode which utilize excellent light emission performance of GaN-based III nitride semiconductor come into practical use, and also, an optical display which utilizes fluorescent properties of GaN is developed.

In the application of GaN for the optical display, it is required to prepare GaN powders, which can be made by following the technique, for example, disclosed in Japanese Patent Application Laid-open 2000-198978 where ammonia solution is dropped in gallium nitric hydrate solution to form gallium hydroxide, and then, obtain porous gallium oxide through moisture elimination, which is heated under ammonia atmosphere to obtain the GaN powders.

Moreover, the GaN powders can be made by means of the technique disclosed in J. American Ceramic Society, 79, 2309–2312 (1996) where metallic gallium is heated within a temperature range of 900–1000° C. and melted to form gallium melt, which is chemically reacted with ammonia gas to obtain the GaN powders.

In a conventional producing method of GaN powders as mentioned above, however, it takes long time of several hours to several days in batch process, so the production efficiency is extremely low and the mass production can not be realized. As of now, therefore, a practically usable producing method and apparatus of GaN powders can not be provided.

SUMMERY OF THE INVENTION

It is an object of the present invention to provide a producing method of GaN powders which is practically usable and can realize the mass production, and an apparatus for producing the GaN powders.

In order to achieve the above object, this invention relates to a method for producing powders made of gallium nitride, comprising:

a creation step of crystal nuclei wherein crystal nuclei made of gallium nitride are created, and a growth step of powders wherein crystals made of gallium nitride are grown from the crystal nuclei of gallium nitride through a chemical reaction between a gallium halide and an ammonia gas on the crystal nuclei of gallium nitride, to produce the gallium nitride powders, the growth step of powders being continued from the creation step of crystal nuclei in period of time.

The Inventor had intensely studied to develop a producing method of GaN powders which can be applied for the mass production of GaN powders through the production in short time of period. As a result, the inventor employed two continuous production steps for the GaN powders instead of a conventional one production step, so produced a large amount of GaN powders in short period of time.

As is described in Japanese Patent Application Tokukai Hei 10-373540, in a conventional producing method, the GaN powders are produced directly from the porous gallium oxide through one production step. In contrast, in the present invention, GaN crystal nuclei are grown in the first production step, and gallium halide and ammonia gas are reacted on the GaN crystal nuclei to produce the GaN powders in the second production step.

In the present invention, although the multi-production steps are employed for producing the GaN powders as mentioned above, the total production period of time can be sufficiently shortened because the reaction period of each step is extremely short and the two production steps are carried out continuously in period of time. Therefore, the producing method of the present invention can be employed for the mass production of GaN powders.

In the present invention, the creation step of crystal nuclei and the growth step of powders can be independently carried out in their respective reactors. In this case, the operationalities of the crystal nuclei creation step and the powder growth step can be developed, and thus, parameters in the steps can be easily controlled.

A producing apparatus of GaN powders according to the present invention comprises:

a creating means of crystal nuclei to create crystal nuclei made of gallium nitride, and a growing means of powders to grow crystals made of gallium nitride from said crystal nuclei of gallium nitride through a chemical reaction between a gallium halide and an ammonia gas on said crystal nuclei of gallium nitride, to produce said gallium nitride powders.

BRIEF DESCRIPTION OF THE DRAWINGS

For better understanding of the present invention, reference is made to the attached drawings, wherein FIG. 5 is a graph showing the relation between the average diameter of GaN powders and the hydrogen halide gas supply rate in a producing method of GaN powders according to the present invention.

DESCRIPTION OF THE PREFERRED EMBODIMENTS

Figure 1:
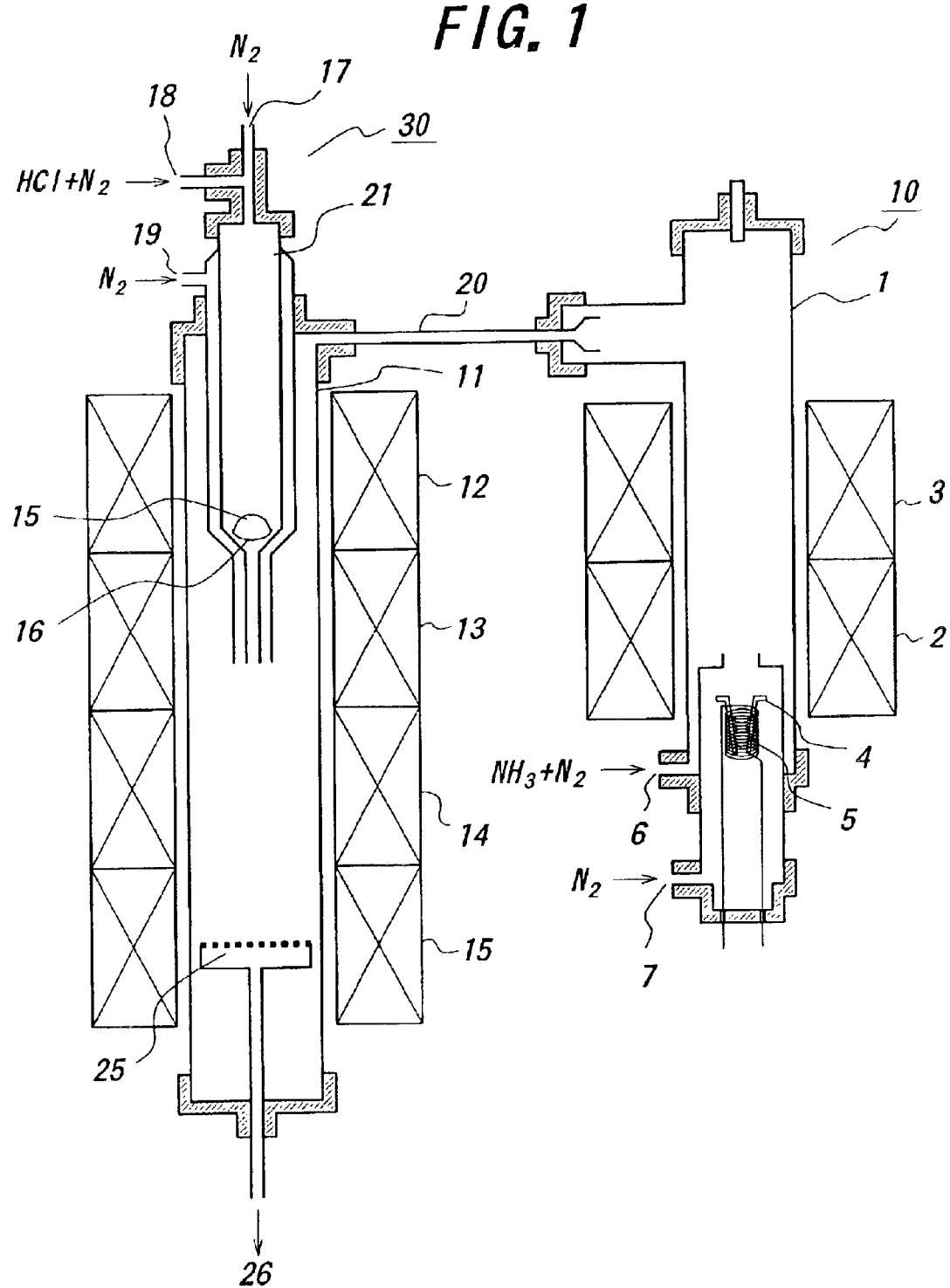
FIG. 1 is a structural view schematically showing an producing apparatus preferably to be employed in producing GaN powders according to the present invention.

This invention will be described in detail with reference to the accompanying drawings. FIG. 1 is a structural view schematically showing an producing apparatus preferably to be employed in producing GaN powders according to the present invention. A producing apparatus of GaN powders illustrated in FIG. 1 is composed of two continuous reactors, one of which is classified in a creation section 10 of GaN crystal nuclei and the other of which is classified in a growth section 30 of GaN powders.

The creation section 10 includes a reactor 1 and cylindrical electric furnaces 2 and 3 provided on the periphery of the reactor 1. Then, a crucible 4 made of e.g., BN is provided in the lower side of the reactor 1 and a coil 5 for heating is provided so as to whirl around the crucible 4. Moreover, gas inlets 6 and 7 are provided in the lower side of the reactor 1.

The growth section 30 includes a reactor 11 and cylindrical electric furnaces 12–15 provided on the periphery of the reactor 11. In the reactor 11 is provided a pre-reactor 21 where a crucible 16 made of e.g., BN is provided and in the upper side of which gas inlets 17–19 are provided. Also, in the lower side of the reactor 11 are provided a filter 25 and a gas outlet 26.

The creation section 10 of GaN crystal nuclei and the growth section 30 of GaN powders are joined with a given cylindrical member 20.

In the producing method of GaN powders of the present invention, first of all, GaN crystal nuclei are created in the creation section 10. A metallic gallium raw material is prepared in the crucible 4, and then, heated at 1400° C. or over to create a gallium vapor. Then, an ammonia gas is introduced with a nitrogen carrier gas into the reactor 1 from the gas inlet 6 and a nitrogen carrier gas is introduced into the reactor 1 from the gas inlet 7 to chemically react the ammonia gas and the gallium vapor and thus, to create GaN crystal nuclei.

The reaction temperature of the ammonia gas and the gallium vapor is not particularly restricted, but preferably set within 1050–1100° C. by controlling the furnaces 2 and 3. In this case, the crystallinity of the GaN crystal nuclei can be much enhanced.

The wording "gallium vapor" means a perfectly gasified vapor and a vapor including minute liquid droplets. It is not required to create the GaN crystal nuclei through the chemical reaction between the gallium vapor and the ammonia gas as mentioned above. The GaN crystal nuclei may be created by another means.

Then, the resultant GaN crystal nuclei are transported into the growth section 30 of GaN powders through the cylindrical member 20 by utilizing e.g., the nitrogen carrier gas.

In the growth section 30, metallic gallium grains are charged into the crucible 16 in the pre-reactor 21, and then, heated to form a gallium melt. Then, a hydrogen halide gas is introduced with a nitrogen carrier gas into the pre-reactor 21 from the gas inlet 18, and a nitrogen carrier gas is also introduced into the pre-reactor 21 from the gas inlet 17. Then, the resultant gallium melt is chemically reacted with the hydrogen halide gas to create a gallium halide raw material gas. The resultant gallium halide raw material gas is transported downward into the reactor 11 with the above nitrogen carrier gas.

Into the reactor 11 are transported the GaN crystal nuclei and the ammonia gas from the creation section 10 and is introduced a nitrogen carrier gas from the gas inlet 19. Therefore, the gallium halide raw material gas is chemically reacted with the ammonia gas on the GaN crystal nuclei to obtain desired GaN powders through the crystal growth of GaN on the GaN crystal nuclei.

The resultant GaN powders are transported downward, and selected and collected with the filter 25. The remnant ammonia gas and hydrogen halide gas and a $NH_4Cl$ gas as a by-product produced through the chemical reaction between the raw material gases are discharged outside from the gas outlet 26.

The crystal growth of GaN on the GaN crystal nuclei is preferably carried out within 900–1100° C. by appropriately controlling the furnaces 12–14. In this case, the crystallinity of the GaN powders can be enhanced.

The furnace 15 is employed to heat the filter 25 so as to prevent the stack of by-product from $NH_4Cl$ gas through vaporization. In this point of view, the area around the filter 25 is heated at about 500° C. with the furnace 15.

In the producing apparatus shown in FIG. 1, the gallium melt is chemically reacted with the hydrogen halide in the pre-reactor 21 to form the gallium halide raw material gas to be used in the powder growth of GaN. Without the pre-reactor 21, however, the gallium halide raw material gas may be introduced into the reactor 11 directly from the outside.

It is desired, however, as mentioned above, that a hydrogen halide is directly introduced into a reactor where the powder growth of GaN is carried out, and then, a gallium halide raw material gas is directly created in the reactor. In this case, the remnant gallium vapor not chemically reacted with the ammonia gas in the creation section 10 of GaN crystal nuclei is transported into the growth section 30 of GaN powders with the nitrogen carrier gas, and then, can be chemically reacted with the hydrogen halide. Therefore, the yield of GaN powders can be enhanced.

Gallium chloride and gallium bromide may be exemplified as the gallium halide. In view of reactivity and availability, the gallium chloride may be preferably employed.

Figure 2:
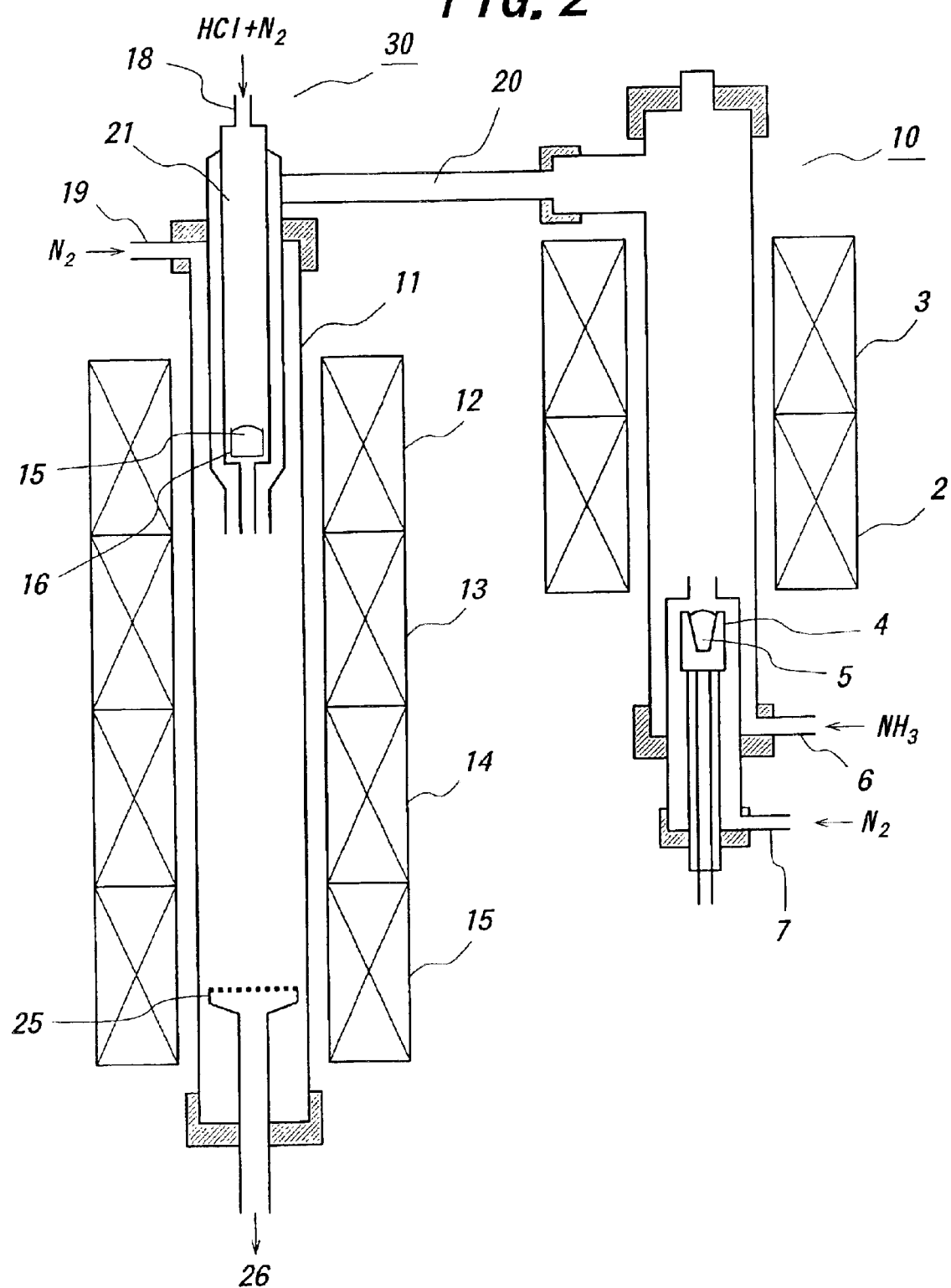
FIG. 2 is another structural view schematically showing an producing apparatus preferably to be employed in producing GaN powders according to the present invention.

FIG. 2 is another structural view schematically showing an producing apparatus preferably to be employed in producing GaN powders according to the present invention. Like constituent elements are designated by like reference numerals throughout.

A producing apparatus of GaN powders illustrated in FIG. 2 is also composed of two continuous reactors as the one illustrated in FIG. 1, one of which is classified in a creation section 10 of GaN crystal nuclei and the other of which is classified in a growth section 30 of GaN powders. The creation section 10 includes a reactor 1 and cylindrical electric furnaces 2 and 3 provided on the periphery of the reactor 1. Then, a crucible 4 made of e.g., BN is provided in the lower side of the reactor 1 and a coil 5 for heating is provided so as to whirl around the crucible 4. Moreover, gas inlets 6 and 7 are provided in the lower side of the reactor 1.

The growth section 30 includes a reactor 11 and cylindrical electric furnaces 12–15 provided on the periphery of the reactor 11. In the reactor 11 is provided a pre-reactor 21 where a crucible 16 made of e.g., BN is provided and in the upper side of which a gas inlet 18 is provided. Also, in the upper side of the reactor 11 is provided a gas inlet 19. Moreover, in the lower side of the reactor 11 are provided a filter 25 and a gas outlet 26.

The creation section 10 of GaN crystal nuclei and the growth section 30 of GaN powders are joined with a given cylindrical member 20.

In the producing apparatus shown in FIG. 2, too, GaN crystal nuclei are created in the creation section 10 as in the producing apparatus shown in FIG. 1. Herein, however, an ammonia gas is introduced into the reactor 1 from the gas inlet 6, and a nitrogen carrier gas is introduced into the reactor 1 from the gas inlet 7. The resultant GaN crystal nuclei are transported into the growth section 30 with the above nitrogen carrier gas through the cylindrical member 20.

In the growth section 30 of the producing apparatus shown in FIG. 2, GaN powders are produced on the producing steps as described with reference to the producing apparatus shown in FIG. 1 fundamentally. That is, a gallium melt created by heating a metallic gallium raw material in the crucible 16 provided in the pre-reactor 21 is chemically reacted with a hydrogen halide introduced from the gas inlet 18 to form a gallium halide raw material gas. Then, the gallium halide raw material gas is chemically reacted with the ammonia gas on the GaN crystal nuclei which are transported from the creation section 10, to produce GaN powders through the crystal growth of GaN on the GaN nuclei.

In the producing apparatus shown in FIG. 2, however, a nitrogen gas is flowed in the space between the pre-reactor 21 and the reactor 11. In this case, the GaN powder yield can be much enhanced, as compared with the producing apparatus shown in FIG. 1. Therefore, the producing ratio of GaN powders can be much increased. In addition, the stack of GaN debris on the inner wall of the reactor 11 can be effectively prevented, so that the maintenance for the producing apparatus can be mitigated.

Herein, the gallium halide raw material gas may be introduced from the outside of the reactor 11 instead of employing the pre-reactor 21, as mentioned above. In this case, the nitrogen gas is flowed along the inner wall of the reactor 11. Another non-active gas such as hydrogen gas may be employed, in addition to the nitrogen gas.

The resultant GaN powders are transported downward with the above nitrogen carrier gas, and then, selected and collected with the filter 25. The remnant ammonia gas and hydrogen halide gas and a $NH_4Cl$ gas as a by-product through the chemical reaction between the raw material gases are discharged outside from the gas outlet 26. The area around the filter 25 is heated at about 500° C. with the furnace 15 so as to prevent the stack of by-product from $NH_4Cl$ gas through vaporization.

The crystal growth of GaN on the GaN crystal nuclei is preferably carried out within 900–1100° C. by appropriately controlling the furnaces 12–14. In this case, the crystallinity of the GaN powders can be enhanced. Other conditions for the producing apparatus may be employed as in the producing apparatus shown in FIG. 1.

EXAMPLES

Example 1

In this Example, GaN powders were produced continuously by utilizing the producing apparatus shown in FIG. 1. The reaction temperature in the creation section 10 of GaN crystal nuclei was set to 1100° C., and the reaction temperature in the growth section 30 of GaN powders was set to 900 C, 1000° C., or 1100° C.

The supply rate of ammonia gas from the gas inlet 6 in the creation section 10 was set to 500 sccm, and the supply rate of nitrogen carrier gas from the gas inlet 6 was set to 500 sccm. The supply rate of nitrogen carrier gas from the gas inlet 7 was set to 3000 sccm. The supply rate of nitrogen carrier gas from the gas inlet 17 in the growth section 30 was set to 500 sccm, and the supply rate of the hydrogen chloride gas from the gas inlet 18 was set to 8 sccm. The supply rate of nitrogen carrier gas from the gas inlet 18 was set to 500 sccm, and the supply rate of nitrogen carrier gas from the gas inlet 19 was set to 500 sccm.

Figure 3:
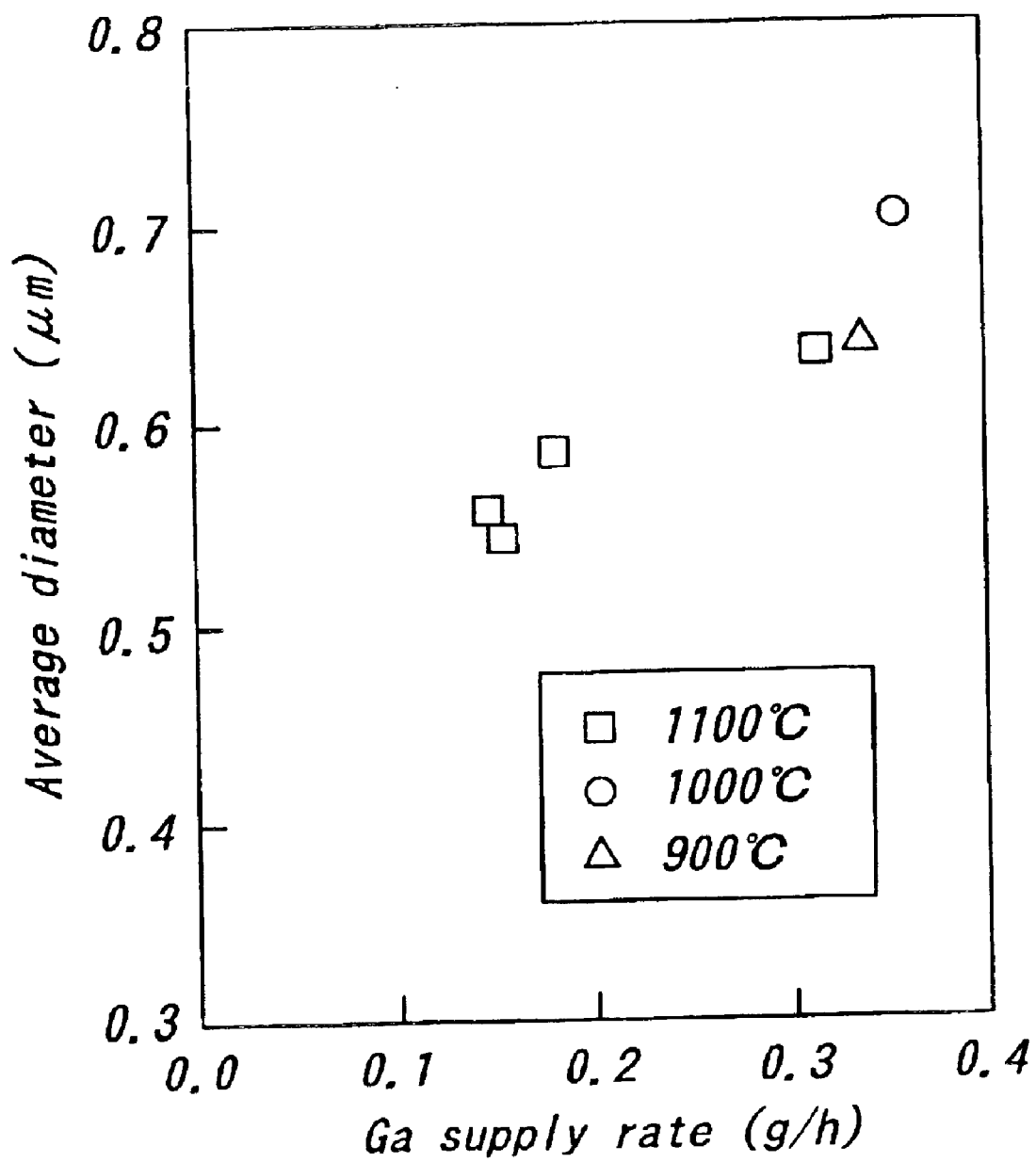
FIG. 3 is a graph showing the relation between the average diameter of GaN powders and the Ga supply rate in a producing method of GaN powders according to the present invention.

FIG. 3 is a graph showing the relation between the average diameter of the resultant GaN powders and the Ga supply rate (g/hr). As is apparent from FIG. 3, the average diameter of GaN powders is increased as the Ga supply rate is increased. In this Example, the GaN powders are grown sufficiently enough to have a large average diameter practically usable, so it is confirmed that the GaN powders practically usable can be obtained according to the present invention. Therefore, the producing period of time can be shortened, and thus, it is turned out that the producing method of the present invention is practically usable.

In this Example, the yield of GaN powders was 10%, and the producing rate of GaN powders was 0.04 g/hr.

Figure 4:
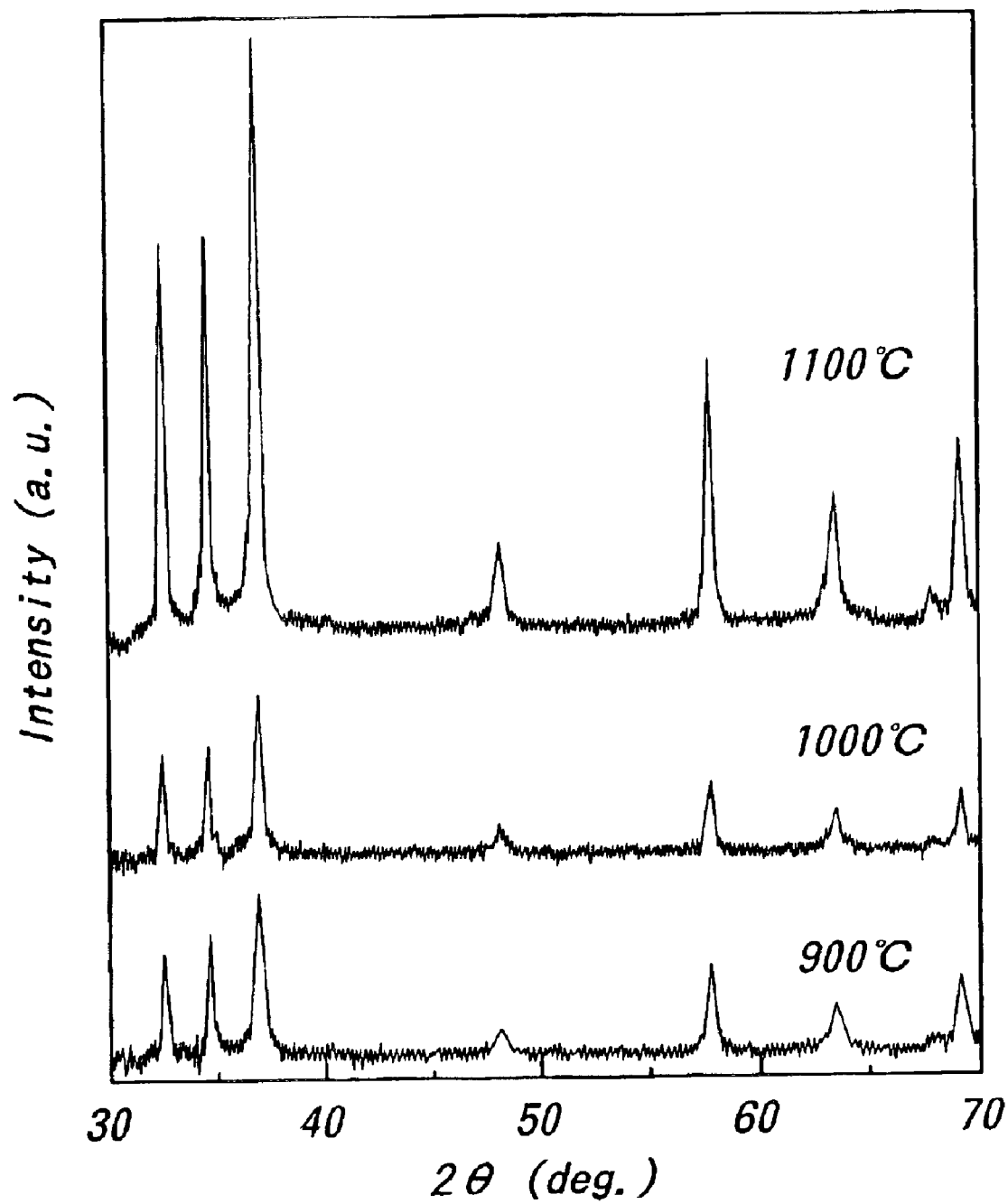
FIG. 4 is a graph showing X-ray diffraction spectra of GaN powders obtained by a producing method of GaN powders according to the present invention.

FIG. 4 is a graph showing X-ray diffraction spectra of the GaN powders produced at 900° C., 1000° C. and 1100° C., respectively. As is apparent from FIG. 4, diffraction peaks from GaN crystal appear within a range of $2\theta=30–70$ degrees. Therefore, it is turned out that the crystallinity of the GaN powders is excellent.

Example 2

In this Example, GaN powders were produced continuously by utilizing the producing apparatus shown in FIG. 2. The reaction temperature in the creation section 10 of GaN crystal nuclei was set to 1100° C., and the reaction temperature in the growth section 30 of GaN powders was set to 900° C., 1000° C., or 1100° C.

The supply rate of ammonia gas from the gas inlet 6 in the creation section 10 was set to 500 sccm, and the supply rate of nitrogen carrier gas from the gas inlet 7 was set to 1000 sccm. The supply rate of the hydrogen chloride gas from the gas inlet 18 in the growth section 30 was set within 2–15 sccm, and the supply rate of nitrogen carrier gas from the gas inlet 18 was set within 25–60 sccm. The supply rate of nitrogen carrier gas from the gas inlet 19 was set to 3800 sccm.

FIG. 5 is a graph showing the relation between the average diameter of the resultant GaN powders and the hydrogen chloride gas supply rate. As is apparent from FIG. 5, the average diameter of the GaN powders is increased as the hydrogen chloride gas supply rate is increased. Therefore, it is turned out that the GaN powders are produced through the powder growth on the GaN crystal nuclei.

In this Example, the yield of GaN powders was 25%, and the producing rate of GaN powders was 0.14 g/hr. It is turned out, therefore, that if the producing apparatus shown in FIG. 2 is employed, the yield and the producing rate of the resultant GaN powders can be enhanced, compared with the one shown in FIG. 1.

Although the present invention was described in detail with reference to the above examples, this invention is not limited to the above disclosure and every kind of variation and modification may be made without departing from the scope of the present invention. For example, in the above embodiments, two independent reactors are prepared, and the creation step of crystal nuclei and the growth step of powders are carried out in the respective reactors, independently. If an open tube-type reactor is prepared, however, the creation step and the growth step can be carried out in the single reactor at a time.

According to the producing method and the producing apparatus of the present invention, GaN powders can be produced continuously. Therefore, the producing period of time of GaN powders can be extremely shortened, and thus, the mass production of GaN powders can be realized, which is different from a conventional batch-type producing method.

What is claimed is:

1. A method for producing powders made of gallium nitride, comprising:

a creation step of crystal nuclei wherein crystal nuclei made of gallium nitride are created, and a growth step of powders wherein crystals made of gallium nitride are grown from said crystal nuclei of gallium nitride through a chemical reaction between a gallium halide and an ammonia gas on said crystal nuclei of gallium nitride, to produce said gallium nitride powders, said growth step of powders being continued from said creation step of crystal nuclei in period of time, said growth step being separated from said creation step of crystal nuclei.

2. The producing method as defined in claim 1, wherein said creation step of crystal nuclei and said growth step of powders are performed in their respective reactors independently provided.

3. The producing method as defined in claim 2, wherein said gallium halide is created through a chemical reaction between a gallium raw material and a hydrogen halide in said reactor.

4. The producing method as defined in claim 3, wherein said gallium halide is created through a chemical reaction between a gallium melt and a hydrogen halide in a pre-reactor provided in said reactor.

5. The producing method as defined in claim 1, wherein said crystal nuclei made of gallium nitride is created through a chemical reaction between a gallium vapor and an ammonia gas.

6. The producing method as defined in claim 1, wherein said creation step of crystal nuclei and said growth step of powders are performed in the same reactor.

7. The producing method as defined in claim 6, further comprising a flowing step of non-active gas wherein a non-active gas is flowed along an inner wall of said reactor.

8. The producing method as defined in claim 7, wherein said gallium halide is created through a chemical reaction between a gallium raw material and a hydrogen halide in said reactor.

9. The producing method as defined in claim 8, wherein said gallium halide is created through a chemical reaction between a gallium melt and a hydrogen halide in a pre-reactor provided in said reactor.

10. The producing method as defined in claim 9, wherein said non-active gas is flowed in a space between said reactor and said pre-reactor.

11. The producing method as defined in claim 7, wherein said non-active gas is at least one of a nitrogen gas and a hydrogen gas.

12. The producing method as defined in claim 1, wherein said gallium halide is a gallium chloride.

13. The producing method as defined in claim 1, wherein said creation step of crystal nuclei is carried out within 1050–1100° C.

14. The producing method as defined in claim 1, wherein said growth step of powders is carried out within 900–1100° C.

15. The producing method as defined in claim 1, further comprising a selection and collection step of powders wherein said gallium nitride powders are selected and collected with a powder selecting and collecting means.

16. The producing method as defined in claim 15, wherein said selection and collection step of powders comprises a heating step to heat an area around said powder selecting and collecting means to a given temperature and thus, to prevent a stack of by-product on said powder selecting and collecting means.

* * * * *